SERIES COMBINATION OF MATCHED TUNNEL DIODE PAIR, PULSE DELAY MEANS AND PUSH-PULL POWER SUPPLY

Filed Dec. 28, 1961

INVENTOR
ARNOLD S. FARBER
BY Stephen J. Limanek
ATTORNEY

United States Patent Office 3,108,199

Patented Oct. 22, 1963

3,108,199

SERIES COMBINATION OF MATCHED TUNNEL DIODE PAIR, PULSE DELAY MEANS AND PUSH-PULL POWER SUPPLY

Arnold S. Farber, Yorktown Heights, N.Y., assignor to International Business Machines Corporation, New York, N.Y., a corporation of New York Filed Dec. 28, 1961, Ser. No. 162,887

7 Claims. (Cl. 307—88.5)

This invention relates to logic circuits and more particularly to synchronous tunnel diode logic circuits.

Since the discovery of the tunnel diode by L. Esaki in 1958 as described in Physical Review, volume 109, pages 603–604, January 15, 1958, "New Phenomenon in Narrow Germanium p-n Junctions," many circuits have been designed in the digital computer field which have attempted to capitalize on the inherent advantages of this relatively new device for both memory and logic applications. The inherent advantages of the tunnel or Esaki diode are high speed, low power dissipation, device simplicity, small size and high stability with changes in environmental conditions such as temperature and nuclear radiation.

Several tunnel diode logic circuits have been reported in the literature, for example, R. H. Bergman, "Tunnel Diode Logic Circuits," IRE Transactions on Electronic Computers, volume EC–9, pages 430–438, December 1960; W. F. Chow, "Tunnel Diode Logic Circuits," Electronics, pages 103–107, June 24, 1960, and E. Goto et al., "Esaki Diode High-Speed Logical Circuits," IRE Transactions on Electronic Computers, volume EC–9, pages 25–29, March 1960. These prior art circuits include single diode monostable circuits, single diode bistable circuits and a serially connected pair of diodes known as the Goto-pair circuit which have been found to operate successfully, but each of them has certain limitations when used in high speed computing systems. In both the single diode monostable and single diode bistable circuits, when a logic signal is applied thereto the load line is shifted beyond the current peak of the well-known current-voltage characteristic curve of the tunnel diode. The gain of these circuits is, therefore, directly related to how close to the peak voltage the diode is biased. This necessitates the maintenance of strict tolerances on the diode characteristics and on the bias supply of the circuit. In the Goto-pair circuit the output pulse which is produced therein has a relatively narrow peak portion.

It is, therefore, an object of this invention to provide an improved logic circuit using tunnel or Esaki diodes.

Another object of this invention is to provide an improved current pulse amplifier.

Still another object of this invention is to provide an improved synchronous current pulse amplifier.

Yet another object of this invention is to provide an improved logic circuit utilizing a pair of tunnel diodes which produces an output voltage having a flatter peak portion.

Still a further object of this invention is to provide an improved tunnel diode circuit which has greatly relaxed tolerance requirements on the amplitude of the supply voltage than that of prior art tunnel diode circuits.

Yet a further object of this invention is to provide an improved twin tunnel diode circuit wherein an alternating current power supply voltage is used solely to lock the output frequency thereof to the power supply frequency.

In accordance with the present invention there is provided a logic circuit which comprises a series combination including a pair of matched tunnel diodes and a pair of pulse delay elements and a push-pull power supply having a direct current source and an alternating current source connected across a series combination of the diodes and pulse delay elements.

An important advantage of the circuit of the present invention is that an output voltage pulse is produced having a flatter peak portion than that produced by prior art twin tunnel diode circuits.

An important feature of this invenion is that when two or more twin tunnel diode circuits are operated in parallel from a common power supply, the switching effect of one circuit on the power supply does not affect the switching of the other circuit or circuits of the parallel combination.

The foregoing and other objects, features and advantages of the invention will be apparent from the following more particular description of preferred embodiments of the invention, as illustrated in the accompanying drawing.

Figure 1:
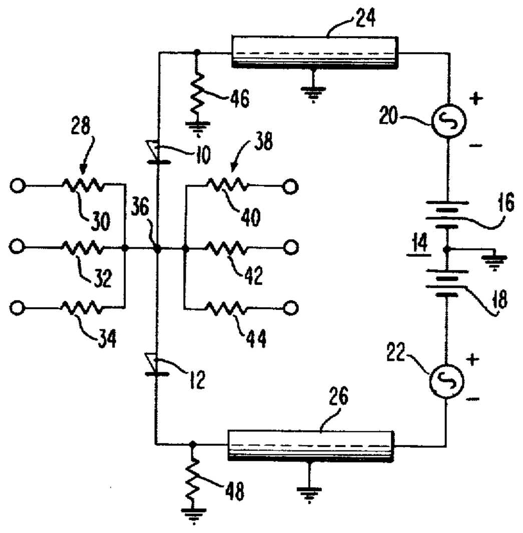
FIG. 1 illustrates an embodiment of the circuit of the present invention.

Referring to the drawing in more detail there is shown in FIG. 1 a first tunnel or Esaki diode 10 connected serially to a second tunnel or Esaki diode 12, the negative terminal of the first diode 10 being connected to the positive terminal of the second diode 12. A low impedance push-pull power supply 14 includes similar first and second direct current sources 16 and 18 and similar first and second alternating current sources 20 and 22, the negative terminal of the first direct current source 16 being connected to a point of ground potential and the positive terminal of the second direct current source 18 also being connected to the point of ground potential. The first alternating current source 20 is connected serially with the first direct current source 16 and the second alternating current source 22 is connected serially with the second direct current source 18 so that the first alternating current source 20 produces a positive voltage with respect to the point of ground potential when the second alternating current source produces a negative voltage with respect to the point of ground potential, as indicated in FIG. 1 of the drawing. A first pulse delay element such as the delay line 24, preferably a transmission line, e.g., either coaxial or strip line, is disposed between the first diode 10 and the first alternating current source 20 of the power supply 14 and a second pulse delay element such as the delay line 26, preferably a transmission line, e.g., either coaxial or strip line, is disposed between the second diode 12 and the second alternating current source 22 of the power supply 14. An input circuit 28 in a fan-in arrangement including first, second and third resistors 30, 32 and 34 is connected to a common point 36 between the first and second diodes 10 and 12. An output circuit 38 in a fan-out arrangement having first, second and third resistors 40, 42 and 44 is also connected to the common point 36 between the first and second diodes 10 and 12. A first resistor 46 is connected across the end of the first delay line 24 adjacent the first diode 10 and a second resistor 48 is connected across the end of the second delay line 26 adjacent the second diode 12. The first and second diodes 10 and 12 should be matched diodes, that is, each of these diodes should have a current voltage characteristic which is similar to that of the other diode. The first and second delay lines 24 and 26 should be similar so as to provide equal pulse delay times therethrough.

Figure 2:
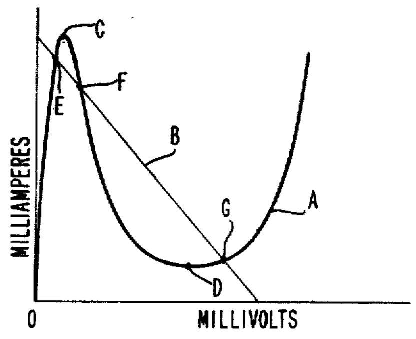
FIG. 2 is a graph indicating current and voltage relationships in the circuit shown in FIG. 1.

FIG. 2 of the drawing shows the current-voltage characteristic of one of the two diodes 10, 12 at curve A and also an instantaneous load line at curve B. The voltage-current characteristic curve A has three principal regions, the low voltage positive resistance region between point O and point C, the peak current of each of the diodes 10, 12, the negative resistance region between point C and point D and the high voltage positive resistance region lying beyond point D.

In the operation of the circuit of the present invention the magnitude of the direct current component from the power supply 14 across the series combination of the diodes 10, 12 and the delay lines 24, 26 must be such that the direct current load line intersects the composite characteristic of the two diodes in series in its negative resistance region. When biased in this manner the circuit is unstable if the instantaneous load impedance across each diode is greater than its negative resistance. The instantaneous load impedance is equal to the impedance seen looking out of the diode terminals with the delay lines 24, 26 replaced by their characteristic impedance. This impedance yields a load line which is approximated by curve B of FIG. 2 of the drawing and which intersects the diode characteristic at point E in the low voltage positive resistance region, point F in the negative resistance region and point G in the high voltage positive resistance region as shown in FIG. 2 of the drawing. The intersections at points E and G are quasi-stable and the intersection at point F is unstable.

In the absence of the sinusoidal component from the power supply 14 the circuit will run freely. For an understanding of this cycle of operation of the circuit assume that the second diode 12 switches from the low voltage positive resistance region to the high voltage positive resistance region while the first diode 10 remains in the low voltage positive resistance region. The changes in the currents through the diodes causes a positive voltage step to be impressed on delay line 24 and a negative step on delay line 26. The magnitude of the step on the second delay line 26 is greater than that on the first delay line 24 by an amount equal to $$\frac{|I_1 - I_2| R_t Z_0}{R_t + Z_0}$$

where $I_1$ and $I_2$ are the currents flowing through the first and second diodes 10 and 12, respectively, $I_1 - I_2$ is the output current, $R_t$ is the resistance value of each of the first and second resistors 46, 48 and $Z_0$ is the characteristic impedance of each of the delay lines 24 and 26. The voltage steps propagate to the power supply ends of the delay lines 24, 26 where they are inverted and reflected by the very low power supply impedance. When these reflected steps return to the diode ends of the delay lines they force the second diode 12 to return to the low voltage positive resistance region of the current-voltage characteristic curve. Further transients on the delay lines 24, 26, initiated by the second diode's transition to the low voltage region, cause the voltage across the first and second diodes 10 and 12 to increase toward the direct current power supply voltage. The arrival of the diodes 10 and 12 in their negative resistance region initiates another cycle.

When the first diode 10 switches into the high voltage positive resistance region resulting in a negative output pulse the operation of the circuit of the present invention is similar to that described hereinabove. The decision as to which of the two diodes 10 and 12 switches into the high voltage positive resistance region is determined by the polarity of the input signal from the input circuit 28 at the time of switching. The logical input signal need only be of sufficient amplitude to overcome any unbalance in the circuit. This unbalance can be caused by mismatched diodes or resistors, an unbalanced power supply and transients present in the lines from the preceding cycles.

The sinusoidal component produced by the alternating current sources 20 and 22 of the power supply 14 is provided to synchronize each of the circuits to a multiphase clocking system which is used when it is desired to direct the flow of information through a logic system in a given direction, as taught by J. Von Neumann in U.S. Patent No. 2,815,488, granted December 3, 1957. The amplitude of this signal can be small with a loose tolerance.

Figure 3:
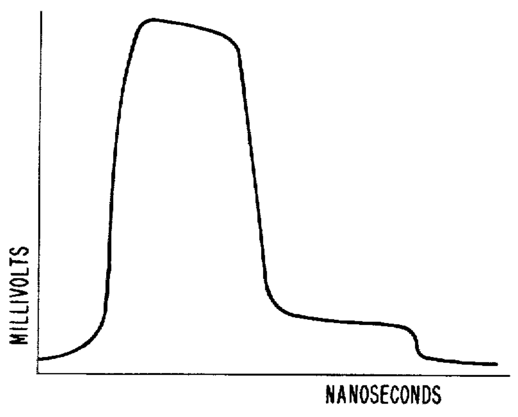
FIG. 3 is a graph showing the output voltage of the circuit of FIG. 1 plotted against time.

The output pulses from the circuit of the present invention, as stated hereinabove, are characterized by a relatively flat top or peak portion, as illustrated in the graph shown in FIG. 3 of the drawing. The width of these pulses is determined by the length of the delay lines and the rise and fall times thereof are determined by the composite circuit RC time constant.

If the direct current voltage biases both diodes in their low voltage regions or in their high voltage regions the circuit is stable with just the direct current component from the power supply 14 and the alternating current component from the power supply 14 is used to carry the diodes into their unstable negative resistance regions.

In the circuit of the present invention which operates as a freely running circuit a matched pair of commercially available five milliampere germanium tunnel diodes biased in their low voltage region may be used. The capacity of each of the diodes which includes stray or package capacity is equal to five micromicrofarads. The freely running circuit may include a resistance of one of the resistors 30, 32 and 34 of the input circuit equal to 200 ohms and a load resistance corresponding to a fan-in plus fan-out of five equal to 50 ohms. The circuit should be provided with a low impedance power supply. The lengths of each of the delay lines should be such that the time for the signal to propagate down the length of the delay line is equal to two nanoseconds and the characteristic impedance of the delay line equal to 50 ohms with a 50 ohm resistance terminating the diode end of each of the delay lines. The voltage of the logic or input signal may be equal to 0.075 volt. With the values of the elements of the circuit as mentioned hereinabove the output pulse is about four nanoseconds wide and the free running period is 18 nanoseconds.

If an alternating current voltage from each of the sources 20 and 22 is provided equal to $$.075 + .025 \sin \frac{2\pi}{16} \times 10^9 t \text{ volts}$$

a pulse repetition rate of 62.5 megacycles is produced with a rise time of about one nanosecond. With each of the delay lines 24 and 26 shortened so that the time for the signal to propagate down the length of the delay line is equal to one nanosecond the tunnel diodes are operated at a pulse repetition rate of 125 megacycles. Improved tunnel diodes having faster switching speeds will provide even higher pulse repetition rates in the circuit of the present invention.

Figure 4:
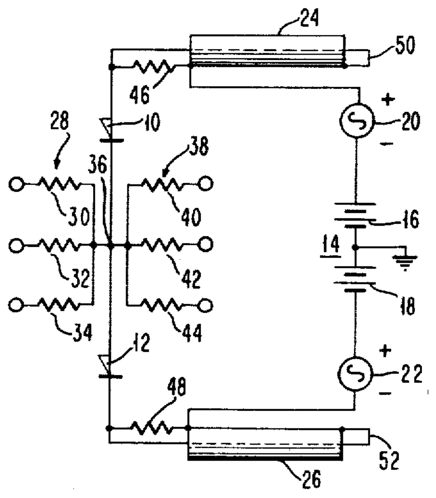
FIG. 4 illustrates another embodiment of the circuit of the present invention.

In FIG. 4 there is illustrated an embodiment of the invention which is somewhat similar to the embodiment illustrated in FIG. 1 but which differs therefrom in that each terminal of the power supply is connected to the outer conductor of the corresponding delay lines 24, 26 at the diode ends thereof and the end of the first delay line 24 opposite the diode end is short circuited by conductor 50 and the end of the second delay line 26 opposite the diode end thereof is short circuited by a conductor 52. The operation of the circuit illustrated in FIG. 4 is similar to the operation of the circuit illustrated in FIG. 1.

When two Goto-pair circuits are operated in parallel from a common power supply, the one that switches first causes a drop in the internal impedance of the supply which tends to influence the second circuit to switch in the same direction. The gain for this second circuit is thereby a function of whether it is switching in the positive or the negative direction. This problem, of course, becomes more serious as more circuits are powered from common power supply terminals. For example, if ten circuits were connected to a common power supply terminal, the first one to switch would tend to make the other nine go the same way, and if the first two went in the same direction, they would influence the remaining eight even more. Thus, it can be seen that if the first nine circuits all went in the positive direction, they would tend very strongly to make the tenth circuit go in the positive direction. It should be understood that ideally all ten of these circuits should switch at the same time. The difference in time between the first one that switches and subsequent ones is due only to slight differences in their characteristics and is generally a small fraction of a nanosecond when a 125 mc. power supply frequency is used. This system problem of the Goto-pair circuits can be mitigated by heavily decoupling each circuit. This decoupling increases the severity of the power supply problem by requiring either a much lower power supply impedance or the distribution of a much larger alternating current power supply voltage which must be divided down for each circuit. This entire problem does not exist in a system employing circuits of this invention because the power supply is not affected by a switching circuit until a time after the switch equal to the propagation time down one of the delay lines. This time is much greater than the possible difference in time between the switching of any two circuits on the same power supply terminals.

The delay lines 24 and 26 shown in FIG. 1 of the drawing offer a flexibility in system layout that is not possible with the Goto-pair. The circuits of the present invention can be distributed in space up to a distance equal to the length of its delay lines away from its low-impedance power source. It would be extremely difficult physically to connect several Goto-pair circuits to the terminals of a single low-impedance power source.

In order to obtain proper operation of any logic circuit it is necessary that the input pulses coincide in time. The problem of achieving coincidence is mitigated by two properties of the circuit of the present invention, namely, it is only sensitive to input signals for a short time interval just before it switches, therefore, the input pulses need only be coincident during that interval and the output pulse has a relatively flat top. When the circuit of this invention is to be used for majority logic an odd number of input pulses to a stage of logic are linearly summed to produce a net input pulse, either positive or negative which determines the polarity of the output pulse of that stage. The circuit of this invention can also perform AND or OR functions by applying a negative or positive direct current voltage to one of the resistors 30, 32 and 34 of the input circuit 28. When it is desired to direct the flow of information in a given direction in a system utilizing the circuits of the present invention a multiphase power supply of the type suggested, as mentioned hereinabove, by J. Von Neumann in U.S. Patent 2,815,488, granted on December 3, 1957, may be used.

Accordingly, it can be seen that an improved circuit has been provided which supplies output pulses having a flat top at a high repetition rate which can perform logic and amplification and which can reshape and retime logical signals.

While the invention has been particularly shown and described with reference to preferred embodiments thereof, it will be understood by those skilled in the art that various changes in form and details may be made therein without departing from the spirit and scope of the invention.

What is claimed is:

1. A logic circuit comprising:

(*a*) a pair of tunnel diodes connected in series relationship and oriented so that the forward direction of current flow is in the same direction, (*b*) a source of electrical energy, (*c*) a pair of means for delaying reflecting and inverting pulses of electrical energy generated by the switching of said tunnel diodes and (*d*) means for interconnecting said diodes, said energy source and said pair of pulse delay means, each of said delay means being connected between said source of electrical energy and a different one of said diodes.

2. A logic circuit comprising:

(*a*) a pair of tunnel diodes, each having a negative and a positive terminal, a negative terminal of one of said diodes being connected to a positive terminal of the other of said diodes, (*b*) a source of electrical energy having a pair of terminals and (*c*) a pair of delay lines, each having a high characteristic impedance compared with the impedance of said energy source so that pulses applied thereto are reflected back to the point of application in inverted form, one of said delay lines coupling said one diode to one terminal of the pair of terminals of said energy source and the other of said delay lines coupling said other diode to the other terminal of the pair of terminals of said energy source, the polarity of said source being selected so that both of said diodes are biased in the forward direction.

3. A logic circuit as set forth in claim 2 wherein said energy source includes (*a*) means for producing a direct current component of electrical energy and (*b*) means for producing an alternating current component of electrical energy.

4. A logic circuit comprising:

(*a*) first and second tunnel diodes having similar current-voltage characteristics and each having a negative terminal and a positive terminal, the negative terminal of said first diode being connected to the positive terminal of said second diode providing a common point therebetween, (*b*) a low impedance push-pull power supply having a positive terminal and a negative terminal and including first and second direct current sources and first and second alternating current sources, said first current source being connected between the positive terminal of said power supply and a point of ground potential through said first alternating current source and said second direct current source being connected between the negative terminal of said power supply and the point of ground potential through said second alternating current source, said first alternating current source providing a positive voltage at the positive terminal of said power supply with respect to the point of ground potential when said second alternating current source provides a negative voltage at the negative terminal of said power supply with respect to the point of ground potential, and (*c*) first and second matched delay lines each having a characteristic impedance substantially higher than that of said power supply, said first delay line interconnecting the positive terminal of said first diode and the positive terminal of said power supply and said second delay line interconnecting the negative terminal of said second diode and the negative terminal of said power supply.

5. A logic circuit as set forth in claim 4 further including means for applying an input signal to and for deriving an output signal from the common point between said first and second diodes.

6. A logic circuit as set forth in claim 5 further including a pair of resistors, one being connected across each of said delay lines at the end thereof remote from said power supply.

7. A logic circuit comprising:

(*a*) first and second matched tunnel diodes, each having a negative terminal and a positive terminal, the negative terminal of said first diode being connected to the positive terminal of said second diode, (*b*) a source of electrical energy having a pair of terminals and including means for producing direct current and alternating current components of electrical energy, (*c*) first and second resistors, said first resistor interconnecting the positive terminal of said first diode and one terminal of said energy source and said second resistor interconnecting the negative terminal of said second diode and the other terminal of said energy source and (*d*) first and second delay lines, said first delay line having one end thereof connected across said first resistor, the other end thereof being short circuited, and said second delay line having one end thereof connected across said second resistor, the other end thereof being short circuited.

References Cited in the file of this patent

UNITED STATES PATENTS 3,056,048 McGrogan ------------ Sept. 25, 1962

OTHER REFERENCES

"Tunnel Diode Manual," by General Electric, dated March 1961, figures 6.4 and 6.7 and pages 60 to 65.

UNITED STATES PATENT OFFICE

CERTIFICATE OF CORRECTION

Patent No. 3,108,199 October 22, 1963

Arnold S. Farber

It is hereby certified that error appears in the above numbered patent requiring correction and that the said Letters Patent should read as corrected below.

Column 6, line 43, after "first" insert -- direct --.

Signed and sealed this 16th day of June 1964.

(SEAL)
Attest:

ERNEST W. SWIDER
Attesting Officer

EDWARD J. BRENNER
Commissioner of Patents